(12) United States Patent
Xia et al.

(10) Patent No.: US 8,339,131 B2
(45) Date of Patent: Dec. 25, 2012

(54) ELECTRIC FIELD SENSOR WITH ELECTRODE INTERLEAVING VIBRATION

(75) Inventors: Shanhong Xia, Beijing (CN); Chao Ye, Beijing (CN); Chao Gong, Beijing (CN); Xianxiang Chen, Beijing (CN); Qiang Bai, Beijing (CN); Shaofeng Chen, Beijing (CN)

(73) Assignee: Institute of Electronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 12/501,721

(22) Filed: Jul. 13, 2009

(65) Prior Publication Data

US 2009/0273337 A1   Nov. 5, 2009

Related U.S. Application Data

(63) Continuation of application No. 11/446,781, filed on Jun. 5, 2006, now abandoned.

(30) Foreign Application Priority Data

Jun. 9, 2005   (CN) .......................... 2005 1 0011895

(51) Int. Cl.
    *G01R 33/02* (2006.01)
(52) U.S. Cl. ........................................ 324/244; 324/259

(58) Field of Classification Search .................. None
See application file for complete search history.

(56) References Cited

U.S. PATENT DOCUMENTS

| 5,909,078 | A   | 6/1999  | Wood et al. ............... 310/307 |
| 6,170,332 | B1* | 1/2001  | MacDonald et al. ...... 73/514.38 |
| 6,526,826 | B2* | 3/2003  | Kurachi et al. ........... 73/504.02 |
| 6,664,786 | B2* | 12/2003 | Kretschmann et al. ... 324/259 |
| 6,679,055 | B1* | 1/2004  | Ellis ............................. 60/527 |
| 6,864,618 | B2* | 3/2005  | Miller et al. ............... 310/309 |
| 2003/0080754 | A1 | 5/2003 | Harris et al. ............... 324/649 |

FOREIGN PATENT DOCUMENTS

| CN | 1525181 A | 9/2004 |
| CN | 1220065 C | 9/2005 |

* cited by examiner

*Primary Examiner* — Roberto Velez
(74) *Attorney, Agent, or Firm* — Westman, Champlin & Kelly, P.A.

(57) ABSTRACT

An electric field sensor comprising: a substrate having a hole; a shielding electrode and a sensing electrode, disposed in the hole of the substrate; a piezoelectric bar having one end connected to the center of the shielding electrode, the other end fixed on the substrate. Present invention provides several electric field sensors, which have the same feature of utilizing electrodes interleaving vibration to modulate external electric field. They have IC-compatible operation voltage and small volume.

17 Claims, 4 Drawing Sheets a) Component parts b) Complete sensor (back view and front view)

(a)

(b)

ELECTRIC FIELD SENSOR WITH ELECTRODE INTERLEAVING VIBRATION

FIELD OF THE INVENTION

This invention relates to an electric field sensor, particularly to the electric field sensor with an electrode interleaving vibration.

BACKGROUND OF THE INVENTION

Electric field sensors (EFSs) have significant importance for many applications. For example, accurate measurements made in different altitude by Electric Field Sensors provide important information in the study of weather phenomena such as thunderstorms. The EFSs are also used to monitor the electric field generated by power line. The EFSs widely used today are based on traditional mechanical technology, which have the advantages of high precision, but with large volume and high power consumption. There are also some miniature EFSs using laterally electrostatic comb-drive, which have small volume but need high driving voltage.

SUMMARY OF THE INVENTION

It is an object of the present invention to provide an electric field sensor with electrode interleaving vibration which can increase the output signal of the sensor.

In order to accomplish the above object, an electric field sensor comprising:
a substrate having a hole;
a shielding electrode and a sensing electrode, disposed in the hole of the substrate;
a piezoelectric bar having one end connected to the center of the shielding electrode, the other end fixed on the substrate.

DETAILED DESCRIPTION OF THE PREFERRED EMBODIMENTS

Figure 1:
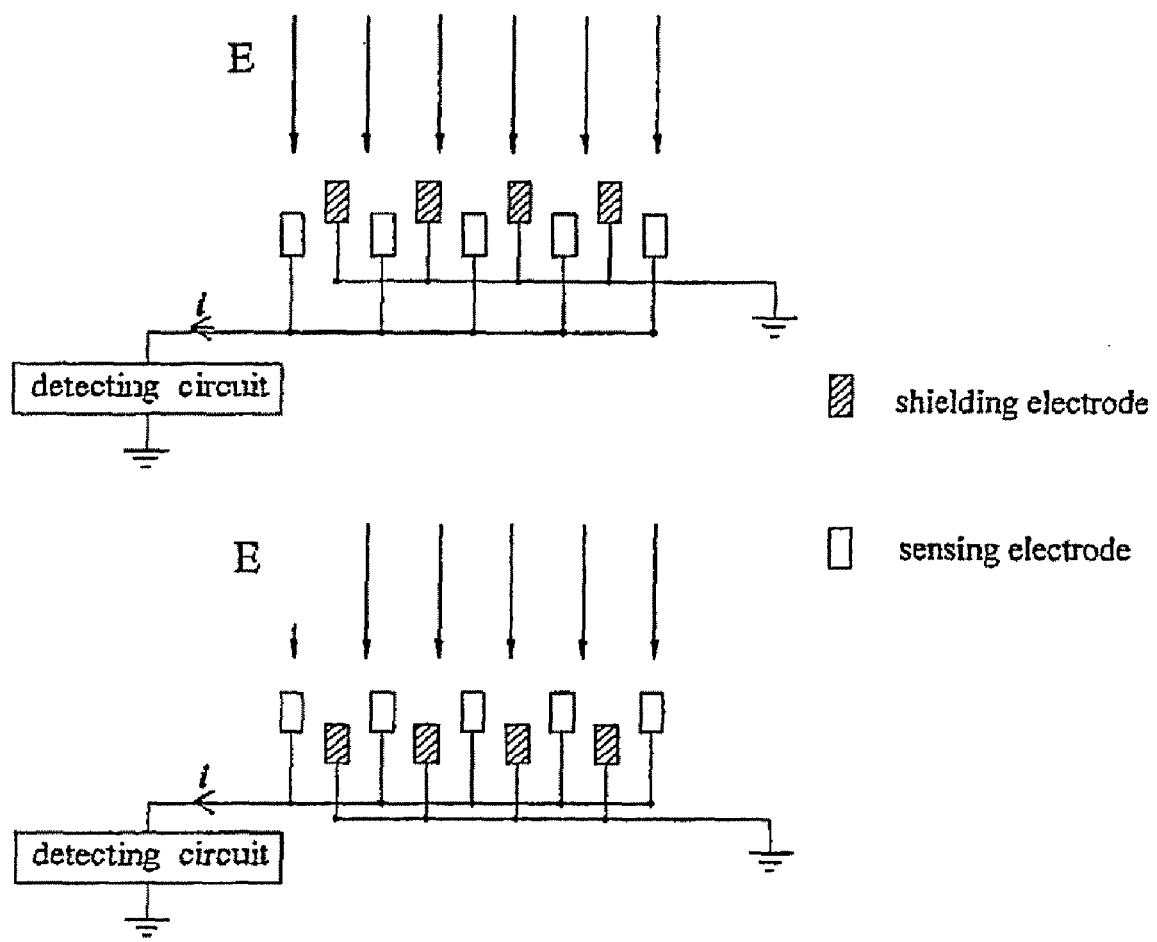
FIG. 1 shows the working principle of EFS with electrode interleaving vibration.
Figure 2:
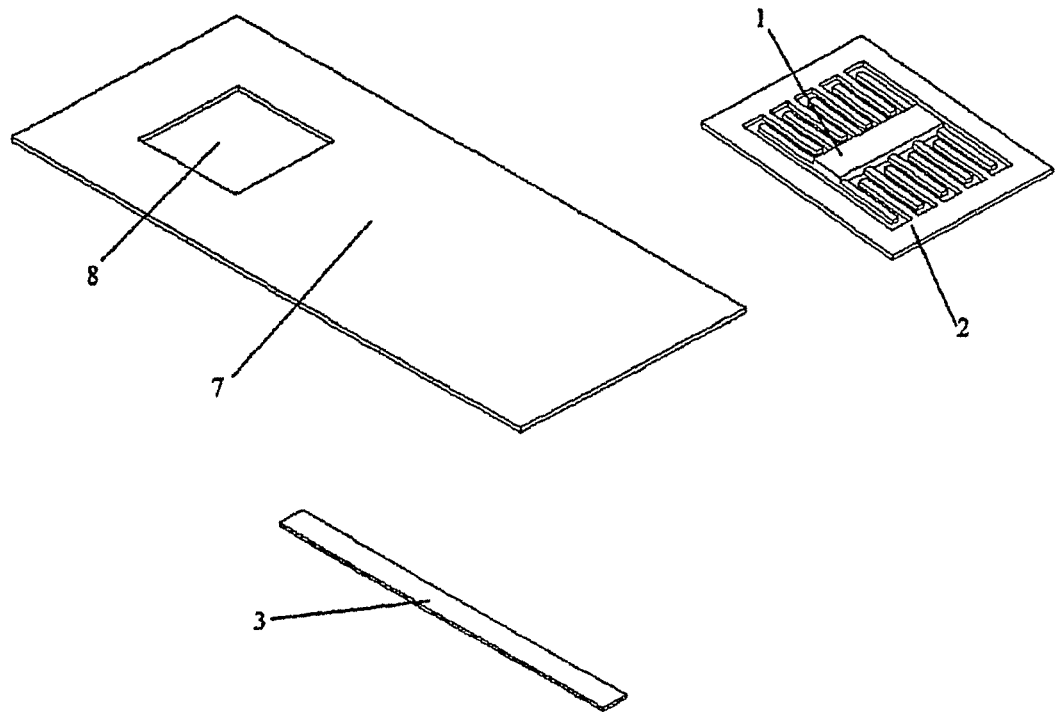
FIG. 2 shows front view and back view of an example of EFS using piezoelectric bar.
Figure 2:
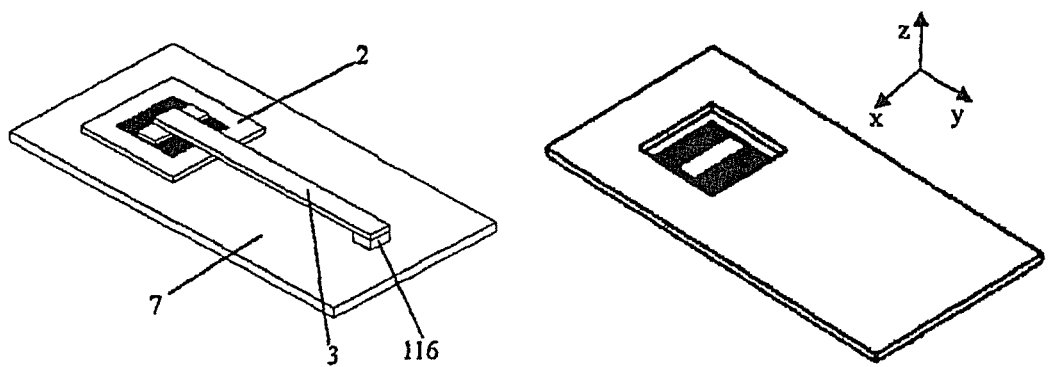
Figure 3:
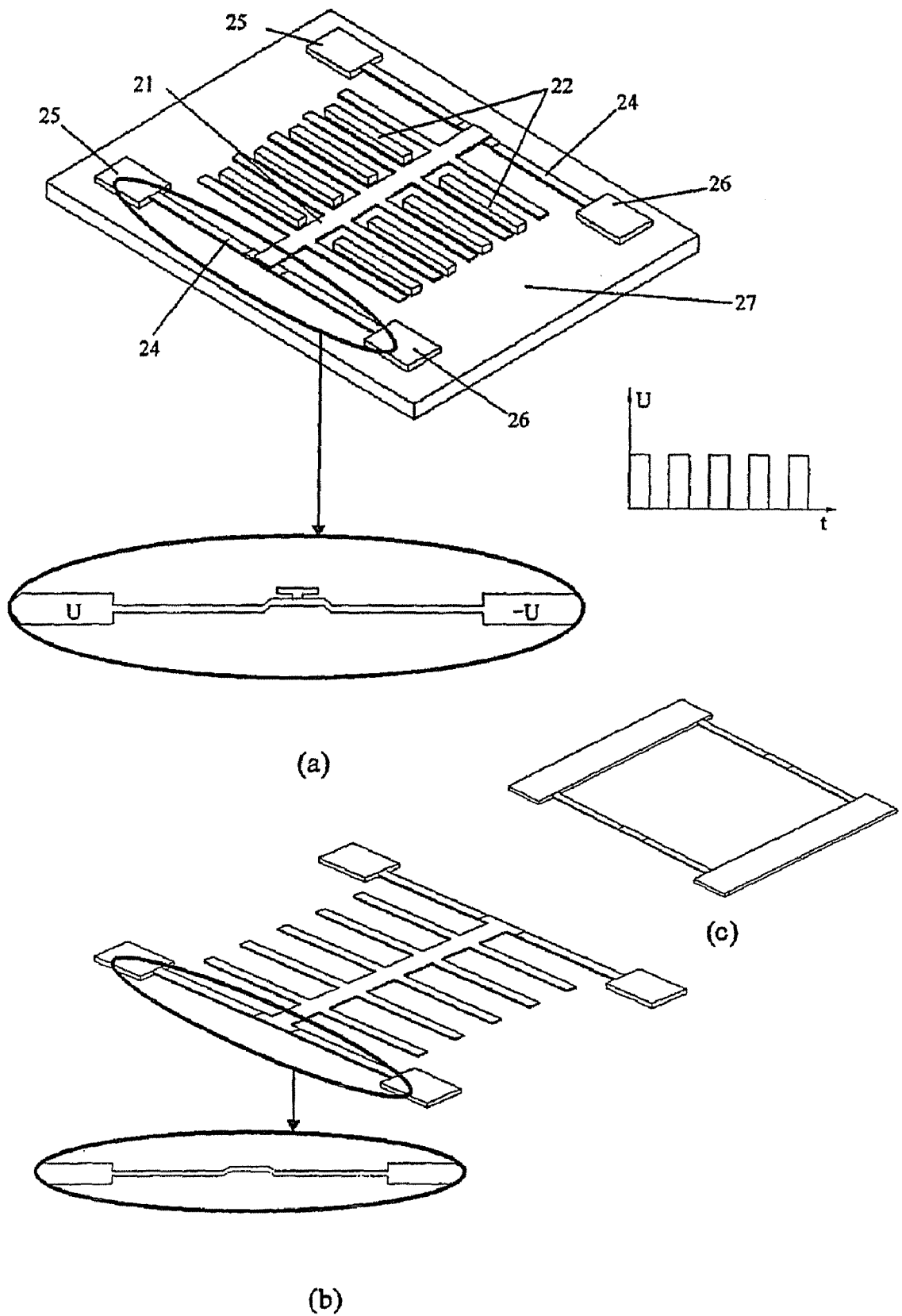
FIG. 3 is schematic view of the first example of EFS using thermal actuation.
Figure 4:
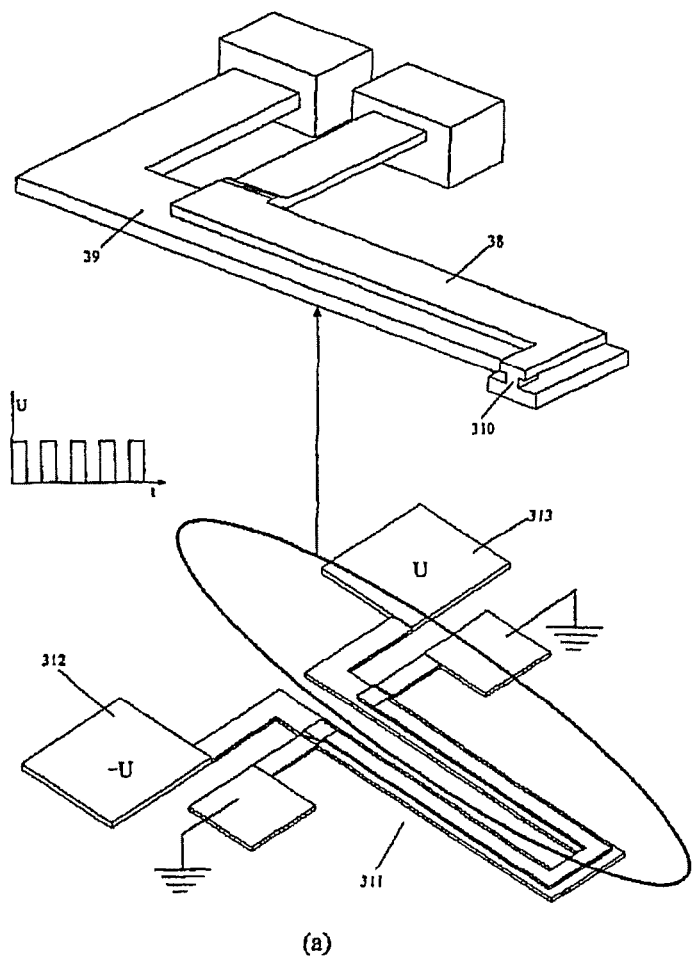
FIG. 4 shows schematic view of the second example of EFS using thermal actuation.
Figure 4:
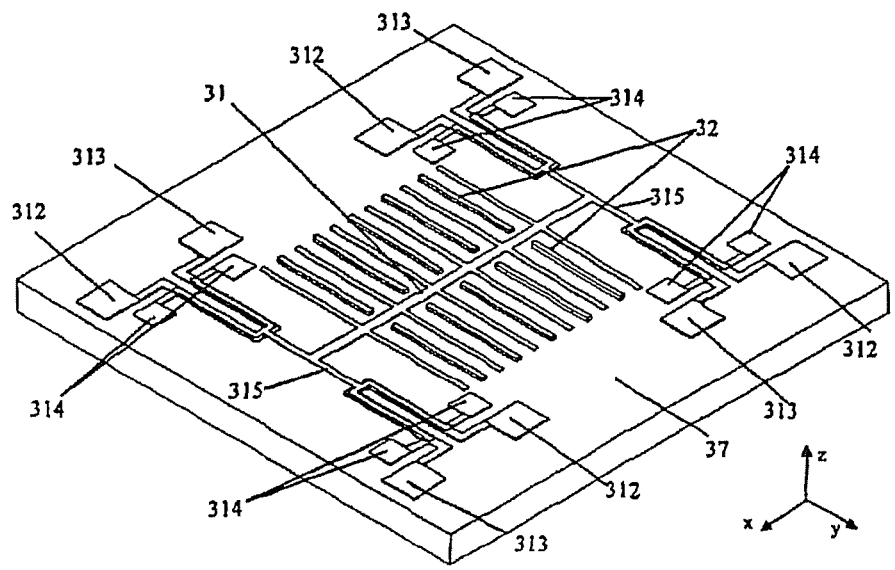

FIG. 1 shows the working principle of the EFS with electrode interleaving vibration. FIG. 2 shows an electric field sensor with piezoelectric driving structure. FIG. 3 and FIG. 4 show an electric field sensor with thermal driving structures. As shown in FIG. 1, the EFS utilizes the interleaving vibration between the shielding electrode and sensing electrode to realize external electric field modulation. In a certain external electric field E, the conductive sensing electrode can induce the charges. As the grounded shielding electrode move vertically, the amount of charges on sensing electrode are varying. The amount of the charge is reduced when top surface of the shielding electrode is higher than the top surface of the sensing electrode and, the shielding electrode is moving upwards. The amount of the charge is increased while the top surface of the shielding electrode is lower than the top surface of the sensing electrode, and the shielding electrode is moving downwards. With the periodical vibration of shielding electrode, an AC output current signal i from sensing electrode is formed, which is used to measure the external electric field intensity.

The electric field sensor can be fabricated by Micro-electromechanical System (EMS) technology, or MEMS technology combined with precise mechanical fabrication technology. To be operated under Integrated Circuit (IC)-compatible voltage, suitable driving method may be chosen such as piezoelectric actuation or thermal actuation. Three typical EFSs are described as examples in this invention: one is the piezoelectric bar, and other ones are thermal actuators.

FIG. 2 shows an example of the EFS using piezoelectric bar. The EFS mainly includes shielding electrode 1, sensing electrode 2, piezoelectric bar 3 and substrate 7. The substrate 7 has a rectangle hole 8, which allows the shielding electrode 1 and the sensing electrode 2 to be placed in. The hole exposes the shielding electrode 1 and sensing electrode 2 to external electric field and provides a space for vibrating shielding electrode 1. The sensing electrode 2 has a rectangle rim with comb fingers inside. The shielding electrode 1 is designed to have a comb shape with its comb fingers alternatively arranging with comb fingers of sensing electrode 2. The slim piezoelectric bar 3 is utilized to actuate the shielding electrode 1. One end of piezoelectric bar 3 is connected with the center of shielding electrode 1, and the other end of piezoelectric bar 3 is fixed on the substrate by the colloidal material 116.

The piezoelectric bar 3 has the advantage of achieving large displacement under low driving voltage. As the piezoelectric bar 3 is applied with AC voltage, it can drive the shielding electrode 1 to vibrate up and down along z-direction, which results in the interleaving vibration between shielding electrode 1 and sensing electrode 2.

The substrate 7 can be designed to have any kinds of shapes such as rectangle, round, echelon and so forth. The substrate can be made from glass or other nonconductive materials. If substrate 7 is made from conductor such as metal, it ought to be grounded and be insulated from sensing electrode 2.

Both shielding electrode 1 and sensing electrode 2 are made from conductors or other conductive materials such as doping silicon. The piezoelectric bar 3 can be fixed on the substrate by colloidal material 116, and also can use other fixed methods such as bonding as long as piezoelectric bar 3 can be fixed.

Other materials such as shape memory alloy may also be adopted for substituting the piezoelectric bar 3.

FIG. 3 shows an example of the EFS with thermal actuation. The EFS mainly includes shielding electrode 21, sensing electrode 22, driving structure 24, substrate 27, and anchors 25, 26. There are many actuators can be used as driving structure in EFS, we present two typical designs in FIG. 3 and FIG. 4 respectively. We use clamp-clamp beams as thermal actuators for EFS in FIG. 3 and U-shaped thermal actuators in FIG. 4.

In FIG. 3, There is an isolating layer on the surface of the substrate 27 and all of the anchors 25, 26 are fixed on the isolating layer. Driving structure 24 is clamp-clamp beam and there is a hump at the center of the beam 24. The ends of clamp-clamp beam are integrated with anchors 25, 26. The Shielding electrode 21 is comb shape and its two ends are respectively fixed on the center hump of two clamp-clamp beams 24. Sensing electrode 22 is comb array and is arranged alternately with the comb fingers of shielding electrode 21.

As a driving voltage is applied to the anchor 25 and anchor 26, Ohmic heating causes the clamp-clamp beam 24 to expand due to a positive thermal coefficient of expansion. The clamp-clamp beam 24 buckles upwards because there is a hump at the center of the beam 24. As the driving voltage is stopped, the clamp-clamp beam 24 could shrink and recover to original shape.

The top surface of shielding electrode 21 is designed to be a little lower than the top surface of the sensing electrode 22, which is to form interleaving vibration. As a rectangle-wave voltage U is applied to the anchor 25 and −U is applied to the anchor 26, the center of clamp-clamp beam 24 is set to zero electric potential since the driving voltage U and −U are equivalent in amplitude and opposite in sine. The clamp-clamp beams 24 actuates the shielding electrode 21 to vibrate up and down along z-direction, which leads to the interleaving vibration between the shielding electrode 21 and the sensing electrode 22. It is also doable to substitute the rectangle-wave voltage with sine voltage.

The substrate 27 can be made from silicon with an insulating layer such as Silicon Nitride, or be made from other insulating materials. The shielding electrode 21, sensing electrode 22, and the clamp-clamp beam 24 can be made from polysilicon or other conductive materials.

There is no limitation for the shape of anchors 25, 26, which can be square, rectangle, round, triangle and so forth. On the surface of the anchor, there is a layer of metal for bonding.

In order to increase the vibration frequency of the clamp-clamp beam, which results in an increase of current signal at the sensing electrode, it is recommended not to design the beam with large width and thickness.

The FIG. 3 (b) shows another design of the shielding electrode 1, which incorporates with clamp-clamp beam 4.

There are also other options for the number of anchors such as 1) in FIG. 3(c), Only two anchors are utilized to connect with clamp-clamp beams (other parts of EFS are not shown) 2) we can add one or more clamp-clamp beams to support the shielding electrode, which are parallel to the existed clamp-clamp beams (the added beams are not shown)

FIG. 4 shows another example of the EFS with thermal actuation. This design is different from above thermal actuation in the structure of actuator. As shown in FIG. 4(a), a U-shaped thermal actuator consists of top layer 38, bottom layer 39 and connector 310. If a voltage is applied across anchor 312 and anchor 313, the current only goes through the bottom layer 39, which will expand due to the increase of its temperature. The temperature difference between top layer 38 and bottom layer 39 causes the end of actuator deflecting upwards.

As anchors 314 are grounded, anchor 312 and 313 are respectively applied across driving voltage U and −U, the connector keeps zero electric potential due to 1) the average value of U and −U is always zero. 2) the anchors 314 are grounded. As a result, the end of U-shaped thermal actuator, where the top layer and bottom layer are connected, vibrates up and down periodically.

If the vibrating track of end of U-shaped thermal actuator is concerned, the vibrating track isn't a straight line but an arc. Although this nonstraight line track is acceptable for EFSs, we also can make some modify to obtain straight line track. We use a pair of U-shaped thermal actuators connected with a beam 315, as shown in FIG. 4(b), the beam 315 is integrated with top layers of two U-shaped thermal actuators. Due to the symmetry of structure, the center of beam 315 is vibrating up and down in a straight line along z-direction. This is one kind of method to obtain straight track in the vibration direction. There are also other methods such as 1) after beam 315 is integrated, we can also add another beam under the beam 315, which is integrated with bottom layer 39. 2) deleting the beam 315, and integrating a new beam with bottom layer 39.

In FIG. 4(b), the complete EFS includes shielding electrode 31, sensing electrode 32, two pairs of U-shaped thermal actuators 311, substrate 37, and anchors 312, 313, 314. There is an isolating layer on the surface of the substrate 37, on which the sensing electrode 32 and all of the anchors 312, 313, 314 are fixed. The comb fingers of shielding electrode 31 are arranged alternately with sensing electrode 32.

On the substrate, we can also add some pairs of U-shaped thermal actuators to support the shielding electrode, which are parallel to the existed U-shaped thermal actuators (the added actuators are not shown)

For above EFSs with thermal actuation of FIG. 3 and FIG. 4, they have the same features in substrate, shielding electrode, and sensing electrode except thermal actuator. It is certainly feasible to use other thermal actuator as long as it can provide vertical actuation. If other thermal actuator is adopted in EFS, it is also needed to consider the formation of straight line track for shielding electrode. If the motion track of shielding electrode is not straight line, it will also be acceptable, since the sensing electrode can also induce the variable amount of charges.

It is also feasible to use electromagnetic actuation with external magnetic field.

It is also doable to use other actuation structures such as piezoelectric actuation structure, electrostatic actuation structures or other actuation structures to substitute the thermal actuation.

What is claimed is:

1. An electric field sensor comprising:
   a planar substrate extending in a horizontal plane and a vertical plane having an insulating surface extending in the horizontal plane;
   at least two anchors being fixed on the insulating surface in the horizontal plane;
   at least two thermal actuators integrated with the anchors, wherein the thermal actuator is a clamp-clamp beam with a hump or a U-shape thermal actuator, wherein the beam extends parallel with the horizontal plane of the substrate;
   a shielding electrode and a sensing electrode being comb shape and extending in the horizontal plane, the shielding electrode supported by the thermal actuators without isolation and the shielding electrode is driven by the at least two thermal actuators to vibrate vertically up and down periodically, wherein the vibration direction of the shielding electrodes is perpendicular to the horizontal plane of the substrate and parallel with the vertical plane of the substrate.

2. The electric field sensor according to claim 1, wherein said thermal actuators are made of polysilicon or other conductive materials without insulating materials.

3. The electric field sensor according to claim 1, wherein said the shape of anchors is square, rectangle, round or triangle and any other shape.

4. The electric field sensor according to claim 1, wherein said top surface of shielding electrode is lower than said top surface of sensing electrode.

5. The electric field sensor according to claim 1, wherein said shielding electrode and thermal actuators are integrated.

6. The electric field sensor according to claim 1, wherein said thermal actuators are clamp-clamp beam.

7. The electric field sensor according to claim 6, wherein at least one clamp-clamp beam is for supporting the shielding electrode.

8. The electric field sensor according to claim 7, wherein said U-shape thermal actuator consisted of top layer, bottom layer and connector.

9. The electric field sensor according to claim 8, wherein said connector is sandwiched between the top layer and bottom layer.

10. The electric field sensor according to claim 8, wherein said top layer and bottom layers are made of polysilicon.

11. The electric field sensor according to claim 7, wherein a beam is connected to the top layer between said at least two thermal actuators.

12. The electric field sensor according to claim 7, further comprising:
   adding a new beam under the original beam, which is connected to a bottom layer.

13. The electric field sensor according to claim 7, wherein a beam is connected to the bottom layer between said at least two thermal actuators.

14. The electric field sensor according to claim 1, wherein said at least one U-shaped thermal actuator is for supporting the shielding electrode.

15. The electric field sensor according to claim 1, wherein said thermal actuators are electromagnetic actuator.

16. The electric field sensor according to claim 1, wherein said thermal actuators provide actuation through piezoelectric actuation, electrostatic actuation or magnetic actuation.

17. The electric field sensor according to claim 1 wherein the shielding electrode is two-dimensionally axisymmetric and central symmetric.

* * * * *